(12) United States Patent
Lim

(10) Patent No.: US 8,384,106 B2
(45) Date of Patent: Feb. 26, 2013

(54) LIGHT EMITTING DEVICE AND LIGHT EMITTING DEVICE PACKAGE HAVING THE SAME

(75) Inventor: Woo Sik Lim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 391 days.

(21) Appl. No.: 12/783,741

(22) Filed: May 20, 2010

(65) Prior Publication Data

US 2010/0295080 A1 Nov. 25, 2010

(30) Foreign Application Priority Data

May 21, 2009 (KR) .................. 10-2009-0044291

(51) Int. Cl.
  *H01L 33/00* (2010.01)
(52) U.S. Cl. .............. 257/98; 257/99; 257/E33.067; 257/E33.055
(58) Field of Classification Search .......... 257/98, 257/99, E33.067, E33.055
See application file for complete search history.

(56) References Cited

U.S. PATENT DOCUMENTS

| 7,723,732 | B2 * | 5/2010 | Tazima et al. ............. 257/79 |
| 2007/0257269 | A1 | 11/2007 | Cho et al. ............. 257/95 |
| 2008/0067916 | A1 * | 3/2008 | Hsu et al. ............. 313/498 |
| 2008/0121903 | A1 * | 5/2008 | Hiramatsu et al. ........ 257/89 |
| 2010/0012969 | A1 * | 1/2010 | Yoon et al. ............. 257/99 |
| 2010/0163906 | A1 | 7/2010 | Hong et al. ............. 257/98 |

FOREIGN PATENT DOCUMENTS

| JP | 2007-088165 A | 4/2007 |
| KR | 10-2008-0061695 A | 7/2008 |
| KR | 10-2008-0093557 A1 | 10/2008 |
| KR | 10-2010-00078778 A | 7/2010 |
| WO | WO 2008/082097 A1 | 7/2008 |

OTHER PUBLICATIONS

Korean Office Action dated Jan. 10, 2011 issued in Application No. 10-2009-0044291.
Korean Office Action dated Apr. 20, 2012 issued in Application No. 10-2009-0044291.
Chinese Office Action date May 18, 2012 issued in Application No. 201010184458.9.

* cited by examiner

*Primary Examiner* — N Drew Richards
*Assistant Examiner* — Yu-Hsi D Sun
(74) *Attorney, Agent, or Firm* — Ked & Associates LLP

(57) ABSTRACT

A light emitting device may comprise a first semiconductor layer having a first and second surfaces, the first and second surfaces being opposite surfaces, the first semiconductor layer having a plurality of semiconductor columns extending from the second surface, the plurality of semiconductor columns being separated from each other; a light emitting structure formed over the first semiconductor layer, the light emitting structure including a first conductive semiconductor layer, an active layer and a second semiconductor layer, the light emitting structure having a side surface and an exposed side surface of a semiconductor column closest to the side surface of the light emitting structure being non-aligned with the side surface of the light emitting structure; and a substrate provided adjacent to the plurality of semiconductor columns.

14 Claims, 12 Drawing Sheets

120  132

US 8,384,106 B2

LIGHT EMITTING DEVICE AND LIGHT EMITTING DEVICE PACKAGE HAVING THE SAME

CROSS-REFERENCE TO RELATED APPLICATION

The present application claims priority under 35 U.S.C. §119 to Korean Patent Application No. 10-2009-0044291, filed on May 21, 2009, the contents of which are incorporated herein by reference.

BACKGROUND

1. Field

One or more embodiments described herein relate to a light emitting device and a light emitting device package having the same.

2. Background

Nitride semiconductors have been applied to a variety of semiconductor devices including optical devices such as light emitting diodes (LEDs), high speed switching devices such as MOSFETs (Metal Oxide Semiconductor Field Effect Transistors) and HEMTs (Hetero junction Field Effect Transistors), and light source of illumination devices or display devices. Various approaches to improve the manufacturing process or a light efficiency of the nitride semiconductor have been applied. However, such approaches have proven inadequate.

SUMMARY

The embodiment provides a light emitting device having a photonic crystal structure capable of reducing crystal defects of a semiconductor layer and improving light extracting efficiency.

The embodiment provides a light emitting device including a plurality of rods and/or an air gap under a first semiconductor layer.

The embodiment provides a light emitting device including at least one of a plurality of rods, a mask layer and an air gap between a substrate and a first semiconductor layer.

The embodiment provides a light emitting device including a first photonic crystal structure using an air gap under a first semiconductor layer and a second photonic crystal structure having a concave-convex structure between a substrate and a first semiconductor layer.

An embodiment provides a light emitting device comprising: a first semiconductor layer at an under portion thereof with a plurality of rods; an air gaps between the rods of the first semiconductor layer; and a plurality of compound semiconductor layers including an active layer on the first semiconductor layer.

An embodiment provides a light emitting device comprising: a first semiconductor layer having a first and second surfaces, the first and second surfaces being opposite surfaces, the first semiconductor layer having a plurality of semiconductor columns extending from the second surface, the plurality of semiconductor columns being separated from each other; a light emitting structure formed over the first semiconductor layer, the light emitting structure including a first conductive semiconductor layer, an active layer and a second semiconductor layer, the light emitting structure having a side surface and an exposed side surface of a semiconductor column closest to the side surface of the light emitting structure being non-aligned with the side surface of the light emitting structure; and a substrate provided adjacent to the plurality of semiconductor columns.

The details of one or more embodiments are set forth in the accompanying drawings and the description below. Other features will be apparent from the description and drawings, and from the claims.

BRIEF DESCRIPTION OF THE DRAWINGS

The embodiments will be described in detail with reference to the following drawings in which like reference numerals refer to like elements wherein.

DETAILED DESCRIPTION

Figure 1:
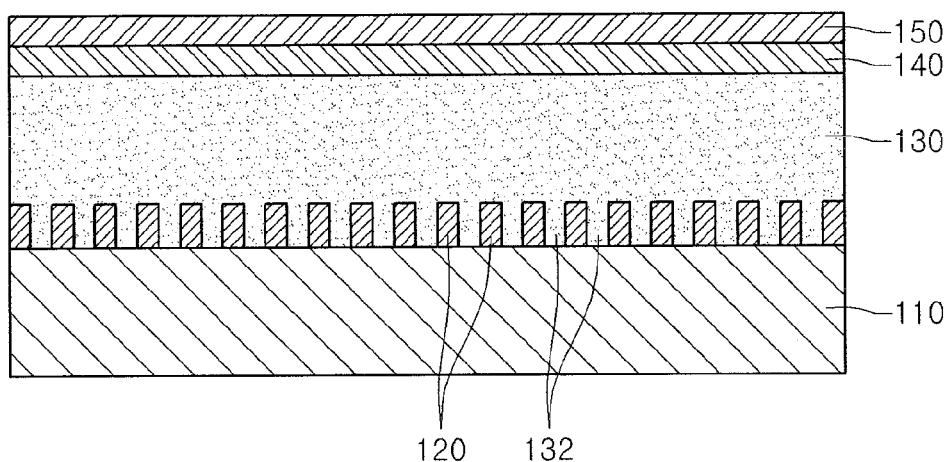
FIG. 1 is a diagram showing a side sectional view of a light emitting device according to first embodiment.

FIG. 1 shows a side sectional view of a light emitting device (LED) according to first embodiment.

The light emitting device 100 includes a substrate 110, a mask layer 120, a first semiconductor layer 130, an active layer 140, and a second conductive type semiconductor layer 150.

The substrate 110 of the light emitting device 100 may include at least one of $Al_2O_3$, SiC, Si, GaAs, GaN, ZnO, Si, GaP, InP, Ge, or $Ga_2O_3$. A plurality of concave-convex structures can be formed on the substrate 110. The concave-convex structures of the substrate 110 may have a lens shape, a hemispherical shape, a stripe shape, or other appropriate shape.

The mask layer 120, e.g., an isolating or dielectric layer, is formed on the substrate 110 of the light emitting device 100. The mask layer 120 comprises a mask material or a photo resist material. The mask layer 120 can be formed by using mask material, such as $SiO_2$, $SiO_x$, $SiN_x$, $SiO_xN_y$, or W.

The first semiconductor layer 130 is formed on the mask layer 120 of the light emitting device 100. The first semiconductor layer 130 may include at least one Group III-V compound semiconductor, such as GaN, InN, AlN, InGaN, AlGaN, InAlGaN, AlInN, AlGaAs, GaP, GaAs, GaAsP, or AlGaInP.

The first semiconductor layer 130 includes a plurality of rods 132. The rods 132 can be made from semiconductor material of the first semiconductor layer 130 or Group III-V compound semiconductor. The rods 132 may include an undoped semiconductor or a first conductive type semiconductor having a dopant of the first conductivity type.

The rods 132 contacts with the substrate 110 through the mask layer 120. The rods 132 are regularly or irregularly disposed in the mask layer 120. Each of the rods 132 may have a column shape, such as a circular column shape, a polygonal column shape, or a trapezoidal column shape, but the embodiment is not limited thereto. The rods 132 can be arranged in a form of a dot matrix or a mesh shape. Each of the rods 132 may have a thickness of 20 μm or less, but the embodiment is not limited thereto.

The first semiconductor layer 130 can have a single layer structure or a multi-layer structure. If the first semiconductor layer 130 has the multi-layer structure, the first semiconductor layer 130 may include an upper layer and a lower layer. The lower layer of the first semiconductor layer 130 corresponds to the thickness of the rods 132, but the embodiment is not limited thereto. The upper and lower layers of the first semiconductor layer 130 can be formed by using different semiconductor materials.

In other words, the first semiconductor layer 130 and the rods 132 can be formed by using the same semiconductor material or different semiconductor materials.

The first semiconductor layer 130 may include an undoped semiconductor layer formed as the lower layer of the first semiconductor layer 130, and the upper layer of the first semiconductor layer 130 may include an undoped semiconductor layer of a different material or the semiconductor layer of the same material as that of the lower layer of the first semiconductor layer 130. If the first semiconductor layer 130 has the single layer structure, the first semiconductor layer 130 may be formed a first conductive type semiconductor layer.

At least the upper layer of the first semiconductor layer 130 is formed as the first conductive type semiconductor layer. The first conductive type semiconductor layer serves as a first electrode contact layer and includes at least one of GaN, InN, AlN, InGaN, AlGaN, InAlGaN, AlInN, AlGaAs, GaP, GaAs, GaAsP, or AlGaInP. If the first conductive type semiconductor layer is an N type semiconductor layer, the first dopant is an N type dopant including at least one of Si, Ge, Sn, Se, or Te.

The first semiconductor layer 130 of the light emitting device 100 is formed with the rods 132 so that defects caused by the epitaxial growth can be reduced and light extracting efficiency can be improved.

A plurality of compound semiconductor layers can be formed on the first semiconductor layer 130 of the light emitting device 100. The compound semiconductor layers of the first semiconductor layer 130 may include the active layer 140 and the second conductive type semiconductor layer 150. The active layer 140 is formed on the first semiconductor layer 130 and includes the Group III-V compound semiconductor. The active layer 140 may have one of a single quantum well structure, a multiple quantum well (MQW) structure, a quantum dot structure, and a quantum wire structure.

The active layer 140 may have a well/barrier layer. For example, the active layer 140 may include one of InGaN well/GaN barrier layer, GaN well/AlGaN barrier layer, or InGaN well/InGaN barrier layer, but the embodiment is not limited thereto. The well layer of the active layer 140 includes material having a band gap lower than a band gap of the barrier layer.

A first conductive type clad layer can be disposed under the active layer 140, e.g. between the first semiconductor layer 130 and the active layer 140. The first conductive type clad layer may include GaN-based semiconductor. The first conductive type clad layer has a band gap higher than a band gap of the active layer 140.

A second conductive type clad layer can be formed on the active layer 140, e.g., between the active layer 140 and the second conductive type semiconductor layer 150. The second conductive type clad layer may include GaN-based semiconductor. The second conductive type clad layer has a band gap higher than the band gap of the active layer 140.

The second conductive type semiconductor layer 150 of the light emitting device 100 is formed over the active layer 140. The second conductive type semiconductor layer 150 may include a compound semiconductor doped with a second dopant. For example, the second conductive type semiconductor layer 150 may include GaN, AlN, AlGaN, InGaN, InN, InAlGaN, AlInN, AlGaAs, GaP, GaAs, GaAsP, or AlGaInP. If the second conductive type semiconductor layer 150 is a P type semiconductor layer, the second dopant is a P type dopant, such as Mg, Zn, Ca, Sr, or Ba.

A transmissive electrode material and/or a reflective electrode material can be formed on the second conductive type semiconductor layer 150. The electrode material formed on the second conductive type semiconductor layer 150 forms at least one of a transparent electrode layer, a reflective electrode layer, and an electrode structure. The transparent electrode layer may include a conductive material which selectively includes oxide and nitride. For example, the transparent electrode layer may include one selected from a group comprising of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), ZnO, IrOx, RuOx, and NiO. In addition, the transparent electrode layer may include one selected from a group comprising of Ag, Ni, Al, Rh, Pd, Ir, Ru, Mg, Zn, Pt, Au, Hf, and a combination thereof.

The electrode layer of the light emitting device 100 may include the reflective electrode material having an ohmic characteristic. The electrode material having the ohmic characteristic can be formed in a predetermined pattern between the electrode layer and the second conductive type semiconductor layer 150, but the embodiment is not limited thereto.

The first semiconductor layer 130 of the light emitting device 100 may be a P type semiconductor layer, and the second conductive type semiconductor layer 150 may be an N type semiconductor layer. In addition, a semiconductor layer having a conductivity opposite of the second conductive type semiconductor layer 150 can be formed on the second conductive type semiconductor layer 150. For example, an N type semiconductor layer can be formed on the P type semiconductor layer 150. Thus, the light emitting structure of the light emitting device 100 may include one of an N—P junction structure, a P—N junction structure, an N—P—N junction structure, or a P—N—P junction structure.

Figure 2:
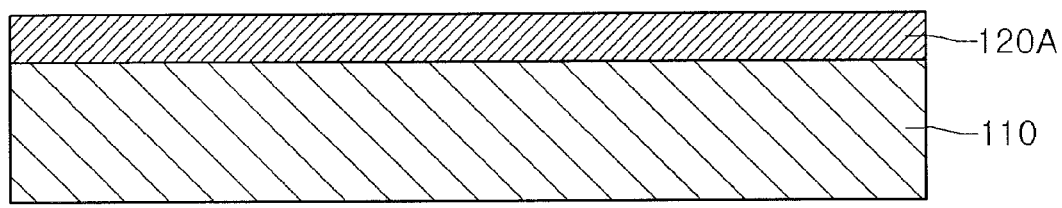
FIGS. 2 to 5 are diagrams showing manufacturing process of the light emitting device shown in FIG. 1.
Figure 3:
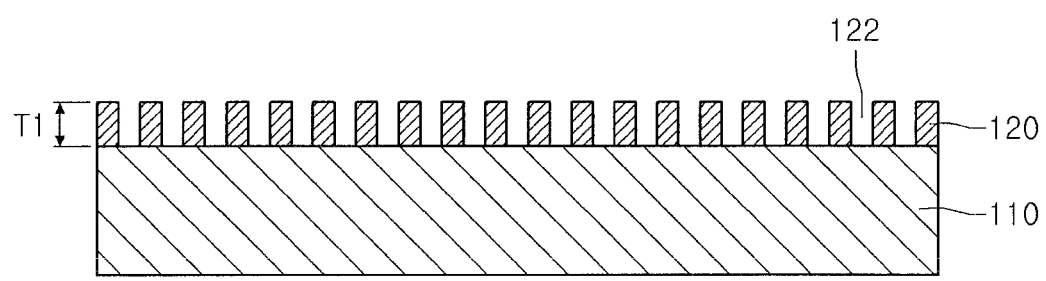

Referring to FIGS. 2 and 3, a mask layer 120 is formed on the substrate 110 of the light emitting device 100. The substrate 110 may include at least one of $Al_2O_3$, SiC, Si, GaAs, GaN, ZnO, Si, GaP, InP, Ge, and $Ga_2O_3$. A buffer layer (not shown) may be formed on the substrate 110 and then the mask layer 120 may be formed on the buffer layer.

The mask layer 120 includes $SiO_2$, $SiO_x$, $SiN_x$, $SiO_xN_y$, or W. The mask layer 20 has a thickness of 20 μm or less, but the embodiment is not limited thereto. The mask layer 120 can be deposited through PECVD (Plasma Enhanced Chemical Vapor Deposition) or sputtering, but the embodiment is not limited thereto.

Figure 4:
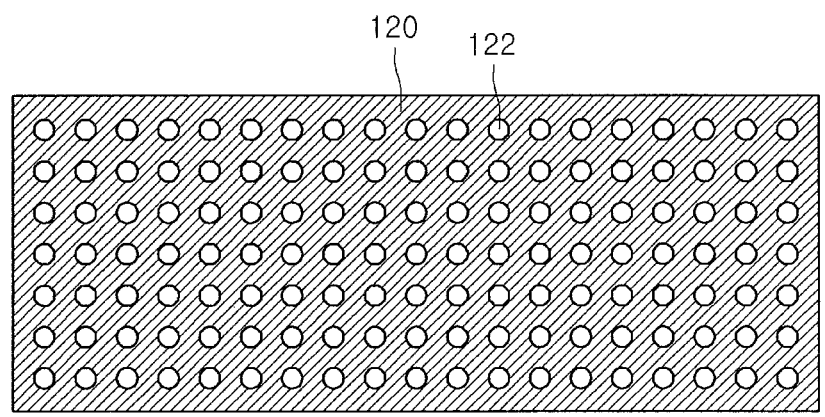

As shown in FIGS. 3 and 4, after placing a mask pattern on the mask layer 120, the mask layer 120 is etched through a photolithography etching process, thereby forming a plurality of rod holes 122 in the mask layer 120.

The rod holes 122 in the mask layer may have a column shape, such as a circular column or a polygonal column, but the embodiment is not limited thereto. As the mask layer 120 is etched, the upper surface of the substrate 110 and/or the buffer layer can be exposed through the rod holes 122. The mask layer 120 can be etched through a dry etching process, but the embodiment is not limited thereto.

The rod holes 122 can be regularly disposed in the mask layer 120 in a form of a dot matrix pattern or in a mesh shape which may be changed according to the shape of the mask pattern. The rod holes 122 can also be irregularly disposed in the mask layer 120. In addition, the rod holes 122 may have the same size or different size and the same shape or different shape, but the embodiment is not limited thereto.

Figure 5:
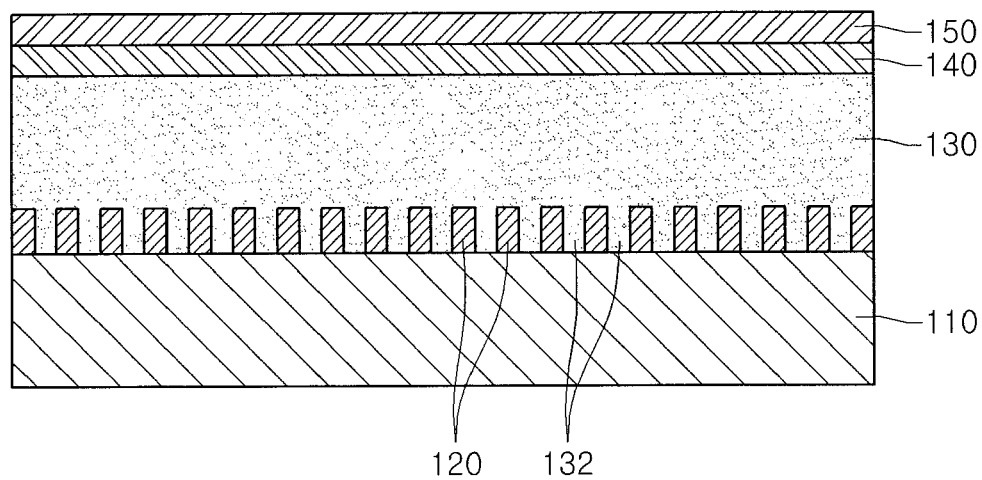

Referring to FIG. 5, the first semiconductor layer 130, the active layer 140, and the second conductive type semiconductor layer 150 of the light emitting device 100 are sequentially formed on the mask layer 120 of the light emitting device 100.

The first semiconductor layer 130 is formed on the mask layer 120 and the rods 132 are formed in the rod holes 122. The rods 132 have the shape of the rod holes 122.

The rods 132 are disposed in the mask layer 120 penetratingly through the structure of the mask layer 120 and may include a semiconductor which is identical or similar to or different from the semiconductor of the first semiconductor layer 130. The rods 132 may include an undoped semiconductor of Group III-V compound semiconductor or a semiconductor doped with a dopant.

An upper region of the first semiconductor layer 130 can be formed as a single layer structure or a multi-layer structure. If the first semiconductor layer 130 is formed as the single layer structure, the first semiconductor layer 130 is formed as the first conductive type semiconductor layer. If the first semiconductor layer 130 is formed as the multi-layer structure, the first semiconductor layer 130 may include an undoped semiconductor layer formed as a lower layer and a first conductive type semiconductor layer formed as an upper layer of the first semiconductor layer 130, but the embodiment is not limited thereto.

The Group III-V compound semiconductor may includes GaN, InN, AlN, InGaN, AlGaN, InAlGaN, AlInN, AlGaAs, GaP, GaAs, GaAsP, or AlGaInP. The first dopant may be doped in the Group III-V compound semiconductor. For example, if the first conductive type semiconductor layer is the N type semiconductor layer, the first dopant is the N type dopant, such as Si, Ge, Sn, Se, or Te.

Growth equipment for the Group III-V nitride semiconductor may include E-beam deposition, PVD (physical vapor deposition), CVD (chemical vapor deposition), PLD (plasma laser deposition), dual-type thermal evaporator, sputtering, and MOCVD (metal organic chemical vapor deposition), but the embodiment is not limited thereto.

The first semiconductor layer 130 is grown from the rods 132. Then, the first semiconductor layer 130 is horizontally grown on the mask layer 120 such that the first semiconductor layer 130 is integrally combined with the mask layer 120. An upper surface of the first semiconductor layer 130 is formed as a flat surface.

When the first semiconductor layer 130 and the rods 132 include GaN, the CVD (chemical vapor deposition) or MOCVD (metal organic chemical vapor deposition) process is adopted. For example, Group III gas, such as TMGa or TEGa, is used as a source gas for Ga, and Group V gas, such as $NH_3$, MMHy or DMHy, is used as a source gas for N.

The first semiconductor layer 130 is grown by controlling growth conditions, such as growth temperature, ratio between the Group V gas and the Group III gas, and growth pressure. As shown in FIG. 3, in the initial stage of growth of the first semiconductor layer 130, the first semiconductor layer 130 is grown from the rod holes 122. As the growth of the first semiconductor layer 130 progresses, the first semiconductor layer 130 is grown on the mask layer 120 and integrally combined with the mask layer 120. When the first semiconductor layer 130 is being grown, the first dopant can be added to the first semiconductor layer 130.

For the growth condition of the rods 132, the growth pressure is relatively increased, the growth temperature is relatively lowered, and the flow rate of Ga is relatively increased, thereby promoting the vertical growth of the rods 132. The first semiconductor layer 130 is grown under the growth condition different from the growth condition for the rods 132.

The first semiconductor layer 130 is further grown from the rods 132 that are grown in the mask layer 120 and then the horizontal growth of the first semiconductor layer 130 is promoted rather than the vertical growth of the first semiconductor layer 130, thereby minimizing defects in the first semiconductor layer 130. That is, the defects caused by lattice mismatch with respect to the substrate 110 can be reduced.

The active layer 140 is formed on the first semiconductor layer 130 and the second conductive type semiconductor layer 150 is formed on the active layer 140. The active layer 140 may include the Group III-V compound semiconductor. The active layer 140 may have one of a single quantum well structure, a multiple quantum well (MQW) structure, a quantum dot structure, and a quantum wire structure. The active layer 140 may have a well/barrier layer. For example, the active layer 140 may include one of InGaN well/GaN barrier layer, a GaN well/AlGaN barrier layer, or an InGaN well/InGaN barrier layer, but the embodiment is not limited thereto. The well layer of the active layer 140 includes material having a band gap lower than a band gap of the barrier layer.

The conductive type clad layers can be formed on and/or under the active layer 140. The conductive type clad layers may include an GaN-based semiconductor and have a band gap higher than the band gap of the active layer 140.

The second conductive type semiconductor layer 150 of the light emitting device 100 may include a compound semiconductor doped with a second dopant. For example, the second conductive type semiconductor layer 150 may include GaN, AlN, AlGaN, InGaN, InN, InAlGaN, AlInN, AlGaAs, GaP, GaAs, GaAsP, or AlGaInP. If the second conductive type semiconductor layer 150 is a P type semiconductor layer, the second dopant is a P type dopant, such as Mg, Zn, Ca, Sr, or Ba.

A transmissive electrode material and/or a reflective electrode material can be formed on the second conductive type semiconductor layer 150. The electrode material formed on the second conductive type semiconductor layer 150 forms at least one of a transparent electrode layer, a reflective electrode layer, and an electrode structure. The transparent electrode layer may include a conductive material which selectively includes oxide and nitride. For example, the transparent electrode layer may include one selected from the group comprising of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), ZnO, IrOx, RuOx, and NiO. In addition, the transparent electrode layer may include one selected from the group comprising of Ag, Ni, Al, Rh, Pd, Ir, Ru, Mg, Zn, Pt, Au, Hf, and a combination thereof.

The electrode layer of the light emitting device 100 may include the reflective electrode material having an ohmic characteristic. The electrode material having the ohmic characteristic can be formed in a predetermined pattern between the electrode layer and the second conductive type semiconductor layer 150, but the embodiment is not limited thereto.

The first semiconductor layer 130 of the light emitting device 100 may include a P type semiconductor layer, and the second conductive type semiconductor layer 150 may include an N type semiconductor layer. In addition, a semiconductor having a polarity opposite to the polarity of the second conductive type semiconductor layer 150 can be formed on the second conductive type semiconductor layer 150. For example, the N type semiconductor layer can be formed on the second conductive type semiconductor layer 150 having the polarity of a P type semiconductor layer. Thus, the light emitting structure of the light emitting device 100 may include one of an N—P junction structure, a P—N junction structure, an N—P—N junction structure, or a P—N—P junction structure.

In the light emitting device 100, the compound semiconductor layers 130, 140, and 150 are grown through the rods 132 that are formed in the mask layer 120, so that defects caused by the epitaxial growth can be reduced and light extracting efficiency can be improved.

Figure 6:
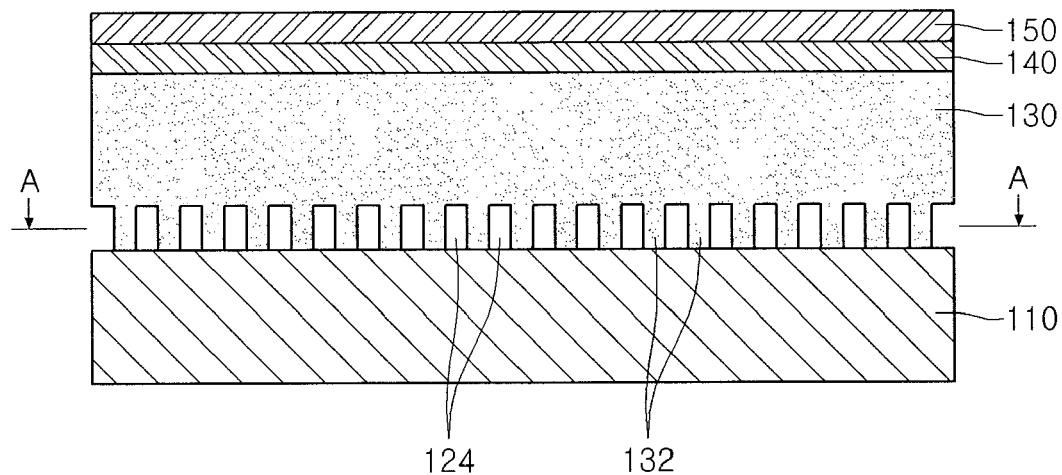
FIG. 6 is a diagram showing a side sectional view of a light emitting device according to second embodiment.
Figure 7:
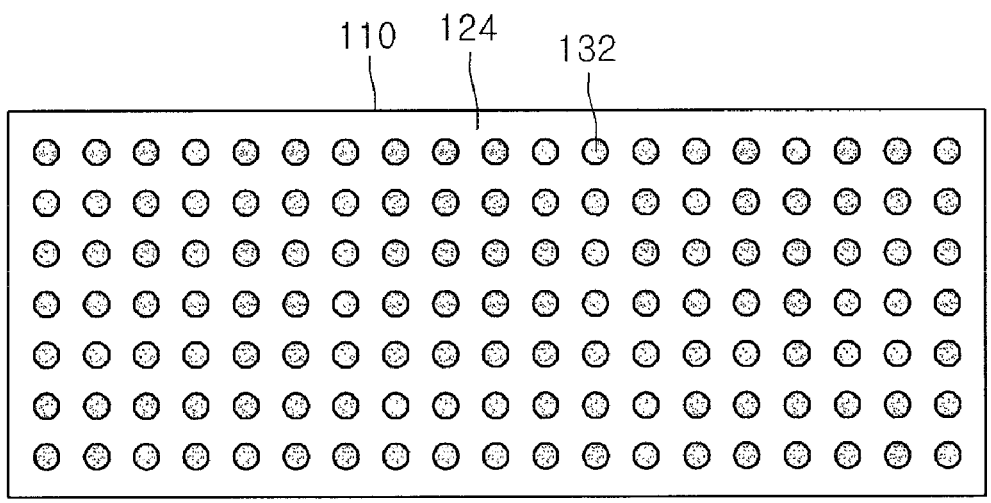
FIG. 7 is a diagram showing a side sectional view taken along line A-A of FIG. 6.

FIGS. 6 to 11 show the second embodiment. The following description will be focused on difference with respect to the first embodiment in order to avoid redundancy. FIG. 6 shows a light emitting device 101 according to the second embodiment and FIG. 7 is a sectional view taken along line A-A shown in FIG. 6. The light emitting device 101 includes a substrate 110, air gaps 124, a first semiconductor layer 130 including a plurality of rods 132, an active layer 140, and a second conductive type semiconductor layer 150.

A buffer layer (not shown) can be formed on the substrate 110 of the light emitting device 101, but the embodiment is not limited thereto. The rods 132 of the first semiconductor layer 130 can be formed on the substrate 110 or the buffer layer. For the purpose of convenience, the following description will be made on the assumption that the rods 132 are formed on the substrate 110 of the light emitting device 101. Air gaps 124 are formed alternately with the rods 132. The air gaps 124 can be alternately disposed with all of the rods 132 or a part of the rods 132. The air gaps 124 are formed on at least an outer peripheral region between the first semiconductor layer 130 and the substrate 110 of the light emitting device 101. The air gaps 124 can be divided into several regions.

As shown in FIG. 7, the air gaps 124 are formed on an entire surface of the substrate 110 except for the region for the rods 132. In this case, the mask layer 120 can be removed. When the air gaps 124 are formed at an outer peripheral portion of an upper surface of the substrate 110, an outer peripheral portion of the mask layer 120 is removed.

As the rods 132 are formed in the mask layer 120 (see, FIG. 1), crystal defects of the first semiconductor layer 130 can be reduced. The first semiconductor layer 130 has a refractive index of 2.12 to 2.44 and the air gaps 124 have a refractive index of 1. Thus, the first semiconductor layer 130 and the air gaps 124 can change the critical angle of the light, so that the light extracting efficiency can be improved.

When the mask layer 120 having $SiO_2$ is formed under the first semiconductor layer 130, the refractive index of the $SiO_2$ is 1.544 to 1.553, but the embodiment is not limited thereto. Thus, the rods 132, the air gaps 124 and the mask layer 120 can reflect the incident light or can change the critical angle of the light. Accordingly, the total internal reflection of the light in the light emitting device 101 can be reduced, so that the light extracting efficiency can be improved.

In addition, the defects occurred in the active layer 140 can be removed so that the quantum efficiency of the light emitting device 101 can be improved. In addition, the light emitting device 101 can be protected from abnormal voltage, such as ESD (Electrostatic Discharge).

Figure 8:
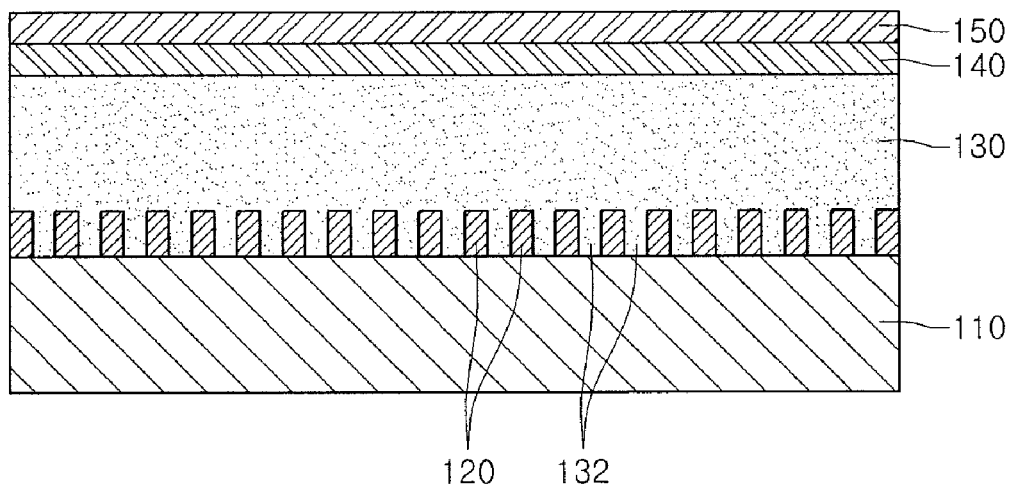
FIGS. 8 to 11 are diagrams showing manufacturing process of the light emitting device shown in FIG. 6.

FIGS. 8 to 11 show the manufacturing process according to the second embodiment. Referring to FIG. 8, the mask layer 120, the first semiconductor layer 130 having the rods 132, the active layer 140 and the second conductive type semiconductor layer 150 are sequentially formed on the substrate 110. The process of forming the above elements is identical or similar to the first embodiment, therefore, it is not further described below.

The first semiconductor layer 130 is grown through the rods 132 that are formed in the mask layer 120, so that the crystal defects caused by difference in lattice constant between the substrate 110 and the first semiconductor layer 130 can be reduced. That is, a contact area between the first semiconductor layer 130 and the substrate 110 can be reduced, so that crystal defects of the first semiconductor layer 130 can be reduced.

Figure 9:
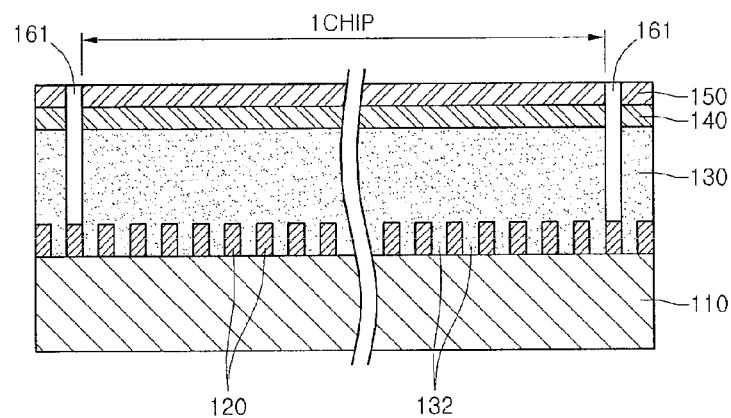

Referring to FIG. 9, at least one hole 161 is formed along a chip boundary region of the light emitting device 101 by a mesa etching process. The hole 161 is formed along the chip boundary region until the mask layer 120 is exposed from the second conductive type semiconductor layer 150. The hole 161 may have a strip shape. A plurality of holes 161 can be provided, but the embodiment is not limited thereto.

Figure 10:
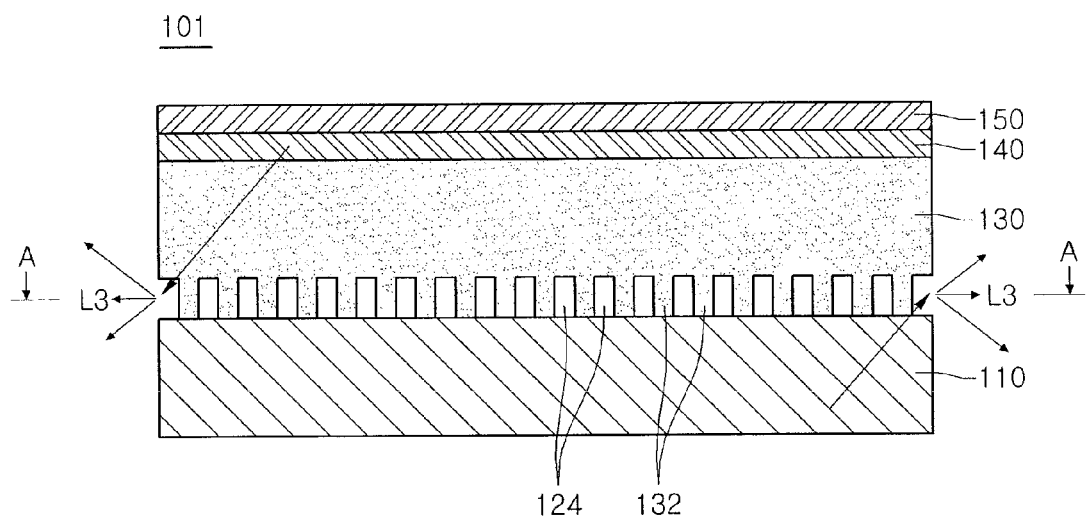
Figure 11:
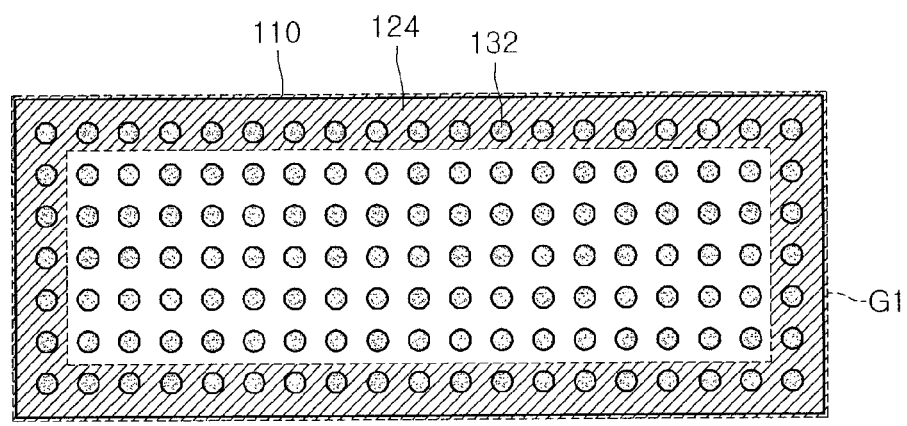

A wet etchant is injected into the hole 161 to remove the mask layer 120 partially or completely. The wet etchant includes HF and/or $NH_4F$, but the embodiment is not limited thereto. In order to remove the mask layer 120, the mesa etching is performed along the chip boundary region. An additional hole 161 may be formed after the semiconductor layer has been grown. The mask layer 120 can be removed after the semiconductor layers of the light emitting device 101 have been formed, but the embodiment is not limited thereto. As shown in FIGS. 10 and 11, if the mask layer 120 is removed, the region for the mask layer serves as the air gaps 124. The air gaps 124 are cavity regions or spacers formed among the rods 132. Referring to FIG. 11 which is a sectional view taken along line A-A of FIG. 10, the air gaps 124 can be formed by etching the mask layer 120 along the chip boundary region. In order to form the air gaps 124, the chip peripheral region G1 is primarily etched such that the air gaps 124 may expand inward through the chip peripheral region G1.

Referring to FIGS. 10 and 11, the refractive index of the first semiconductor layer 130 is 2.12 to 2.44 and the refractive index of the air gaps 124 is 1. Due to such difference in the refractive indexes of the first semiconductor layer and the air gaps 124, the first semiconductor layer 130 and the air gaps 124 can change the critical angle of the light L3 and thus, the light L3 can be extracted. The air gaps 124 and the rods 132 provide two-dimensional photonic crystal structure under the first semiconductor layer 130, thereby improving the light extracting efficiency. The photonic crystal structure is a periodic optical structure that is formed to affect the motion of photons. The air gaps 124 and/or the rods 132 may have the periodic optical structure or an optical crystal lattice structure. The periodicity of the photonic crystal structure is to be of the same length-scale as half the wavelength. The rods 132 can be disposed at a predetermined interval that is determined according to the emission wavelength, but the embodiment is not limited thereto.

When the mask layer 120 having $SiO_2$ is formed under the first semiconductor layer 130, the refractive index of the $SiO_2$ is 1.544 to 1.553, but the embodiment is not limited thereto. Thus, the light can be reflected or the critical angle of the light can be changed due to the difference in refractive indexes along mediums, such as the rods 132, the air gaps 124, and the mask layer 120, so that the total internal reflection of the light can be reduced and thus, the light extracting efficiency can be improved.

Figure 12:
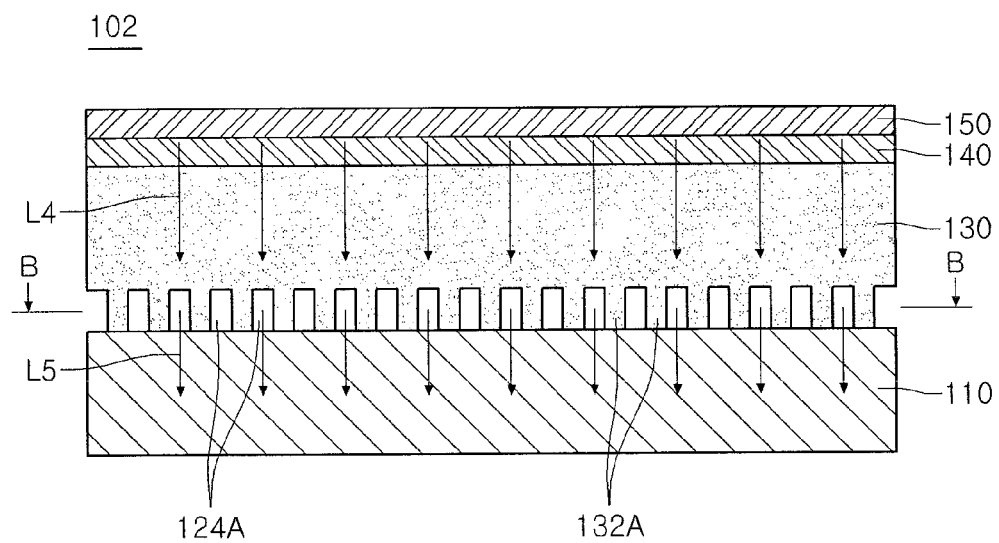
FIG. 12 is a diagram showing a side sectional view of a light emitting device according to third embodiment.
Figure 13:
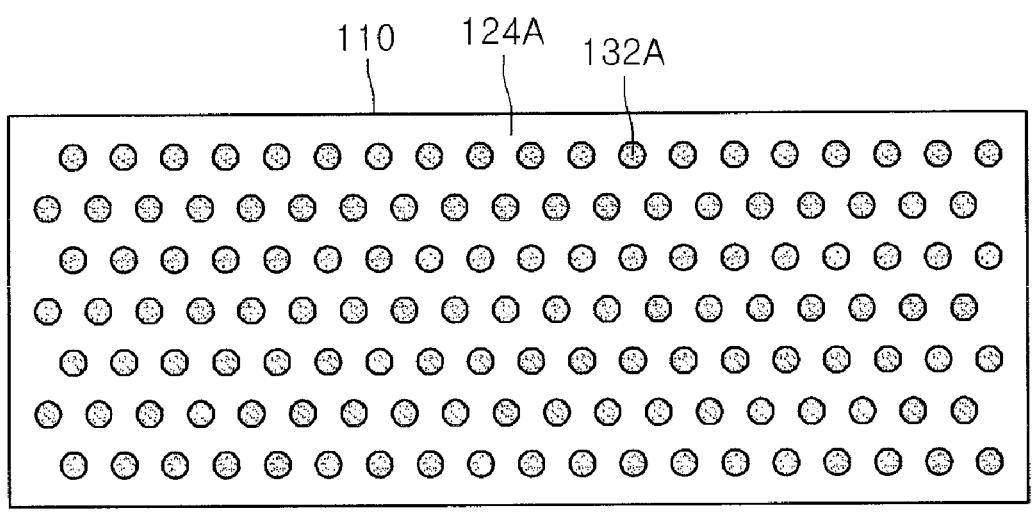
FIG. 13 is a diagram showing a side sectional view taken along line B-B of FIG. 12.

FIG. 12 shows a side sectional view of a light emitting device 102 according to the third embodiment, and FIG. 13 shows a side sectional view taken along line B-B of FIG. 12. The following description will be focused on difference with respect to the above embodiments in order to avoid redundancy.

Referring to FIGS. 12 and 13, the light emitting device 102 includes a plurality of rods 132A and air gaps 124A disposed on the substrate 110 in a zigzag fashion. The rods 132A and/or air gaps 124A may have the periodic optical structure or the optical crystal lattice structure. The air gaps 124A are formed between the first semiconductor layer 130 and the substrate 110 in the two-dimensional photonic crystal structure, so that the light L4 emitted from the active layer 140 proceeds to the air gaps 124A. Thus, the critical angle of light L5 through the air gaps 124A is changed or the light L5 is reflected or refracted. Thus, the external quantum efficiency of the light emitting device 102 can be improved.

Figure 14:
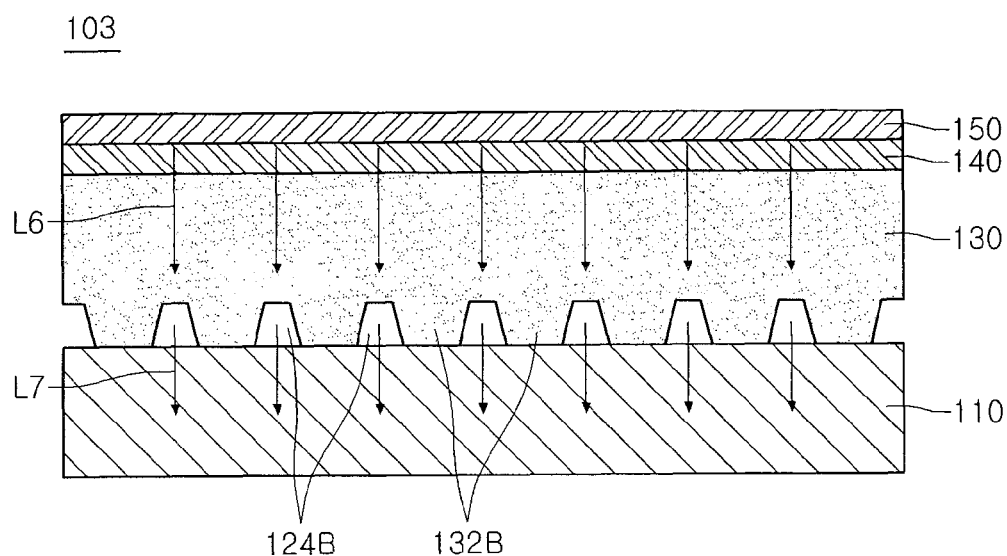
FIG. 14 is a diagram showing a side sectional view of a light emitting device according to fourth embodiment.

FIG. 14 shows a side sectional view of a light emitting device 103 according to the fourth embodiment. The following description will be focused on difference with respect to the above embodiments in order to avoid redundancy.

Referring to FIG. 14, the light emitting device 103 includes a plurality of rods 132B and air gaps 124B disposed on the substrate 110. The air gaps 124B are formed between the first semiconductor layer 130 and the substrate 110 in the two-dimensional photonic crystal structure. Each rod 132B can have a larger upper portion and a smaller lower portion. The rods 132B may have one or more of different shapes. For example, the rods 132B have a trapezoidal shape, a circular conical shape, or a poly-pyramidal rod shape. The shape of the rods 132B can be changed depending on the shape of the rod holes (see, FIG. 3), but the embodiment is not limited thereto. All air gaps 124B are connected with each other or adjacent air gaps 124B are connected with each other. Side surfaces of the air gaps 124B, which make contact with the rods 132B, can be inclined. The light extracting efficiency can be improved by the inclined surfaces of the air gaps 124B.

In the light emitting device 103, the light L6 that is emitted from the active layer 140, is traveled to the air gaps 124B, and the critical angle of the light L7 passing through the air gaps 124B can be changed so that the light L7 can be reflected or refracted. Thus, the light extracting efficiency of the light emitting device 103 can be improved.

Figure 15:
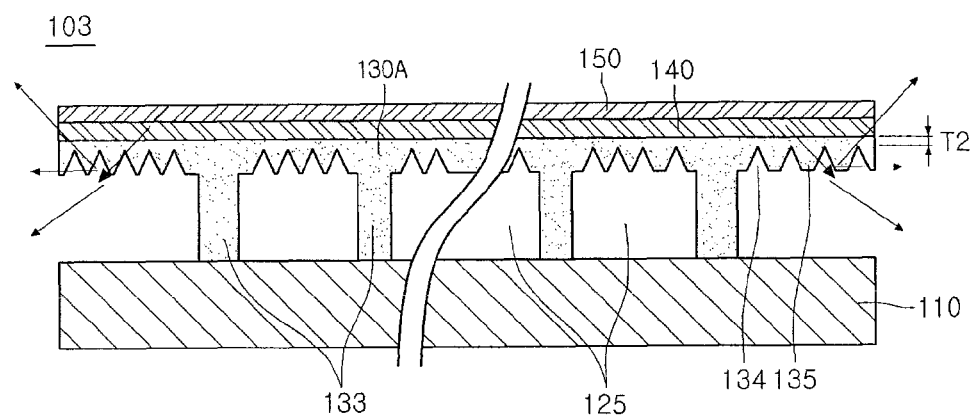
FIG. 15 is a diagram showing a side sectional view of a light emitting device according to fifth embodiment.

FIG. 15 shows a side sectional view of a light emitting device 103 according to the fifth embodiment. The following description will be focused on difference with respect to the above embodiments in order to avoid redundancy.

Referring to FIG. 15, the light emitting device 103 includes a first semiconductor layer 130A having a plurality of rods 133 and roughness 134 and 135 on the substrate 110. Air gaps 125 are interposed between rods 133 formed between the first semiconductor layer 130A and the substrate 110.

The roughness 134 and 135 is formed on an under surface of the first semiconductor layer 130A. The roughness 134 and 135 may have a concave-convex structure. After partially or fully etching the mask layer 120 (see, FIG. 9) by the process described in the second embodiment, the roughness 134 and 135 are formed on the under surface of the first semiconductor layer 130A which make contact with the air gaps 125. An N-polarity crystal plane can be formed on the under surface of the first semiconductor layer 130A and the etching process may include the wet etching process. As the under surface of the first semiconductor layer 130A is etched, the rods 133 of the first semiconductor layer 130A may have a thickness larger than a thickness of the mask layer 120 (see, FIG. 9). The roughness 134 and 135 can be regularly or irregularly formed. The roughness 134 and 135, the rods 133 and the air gaps 125, which are formed under the first semiconductor layer 130A, may be formed as the hybrid photonic crystal structure, so that the defects caused by the epitaxial growth can be reduced and the light extracting efficiency can be improved. The hybrid photonic crystal structure includes a two-dimensional photonic crystal structure and a three-dimensional photonic crystal structure.

The roughness 134 and 135 can be formed on the whole area of the under surface of the first semiconductor layer 130A or along an outer peripheral portion of the under surface of the first semiconductor layer 130A.

A non-etched portion of the first semiconductor layer 130A has a thickness T2 which does not exert an influence upon the operational characteristics of the first semiconductor layer 130A and the embodiment does not limit to the such thickness T2.

Figure 16:
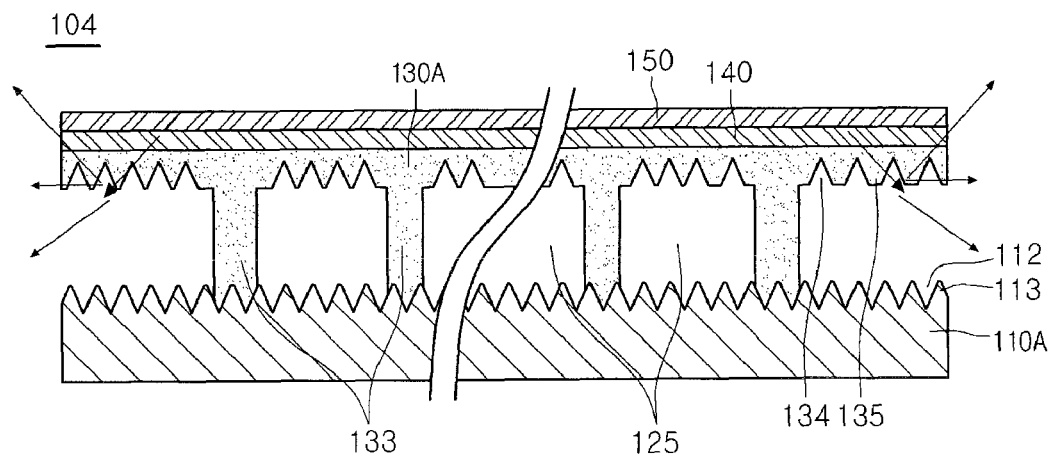
FIG. 16 is a diagram showing a side sectional view of a light emitting device according to sixth embodiment.

FIG. 16 shows a side sectional view of a light emitting device 104 according to the sixth embodiment. The following description will be focused on difference with respect to the above embodiments in order to avoid redundancy. The light emitting device 104 includes concave-convex structures 112 and 113 formed on the upper surface of the substrate 110A. The first semiconductor layer 130A is formed on the under surface thereof having the roughness 134 and 135, the air gaps 125, and the rods 133.

Concave-convex structures 112 and 113 can be formed on an upper surface of the substrate 110A by wet etching and/or dry etching the upper surface of the substrate 110A. The concave-convex structures 112 and 113 may have a polygonal shape, such as a triangular shape, a conical shape, or a lens shape. The concave-convex structures 112 and 113 can be formed in a form of a dot matrix or a stripe, but the embodiment is not limited thereto. The roughness 134 and 135 are formed on the under surface of the first semiconductor layer 130A. The rods 133 and the air gaps 125 are formed between the first semiconductor layer 130A and the substrate 110A.

The roughness 134 and 135, the rods 133, the air gaps 125 and the concave-convex structures 112 and 113, which are formed under the first semiconductor layer 130A, may be formed as the hybrid photonic crystal structure, so that the defects caused by the epitaxial growth can be reduced. In addition, the critical angle of the light that is directed downward from the first semiconductor layer 130A, is changed or the light is reflected or refracted, so that the light extracting efficiency can be improved.

Figure 17:
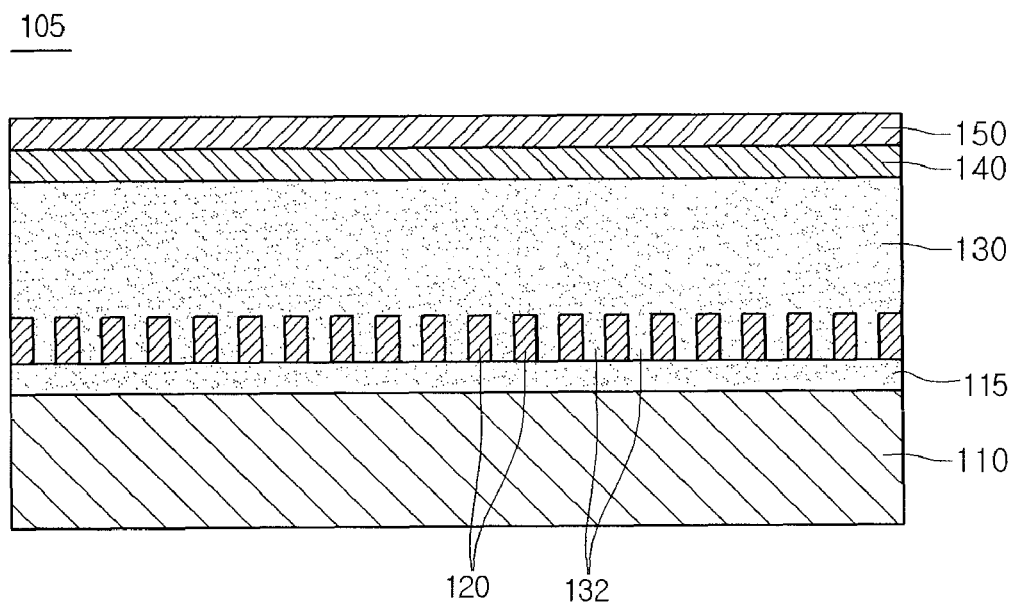
FIG. 17 is a diagram showing a side sectional view of a light emitting device according to seventh embodiment.

FIG. 17 shows a side sectional view of a light emitting device 105 according to the seventh embodiment. The following description will be focused on difference with respect to the above embodiments in order to avoid redundancy. The light emitting device 105 includes a third semiconductor layer 115 formed on the substrate 110. The third semiconductor layer 115 includes the Group II to VI compound semiconductor, such as ZnO or GaN. The third semiconductor layer 115 can be formed under the rods 132 of the first semiconductor layer 130 and the mask layer 120. The third semiconductor layer 115 can be patterned or layered, but the embodiment is not limited thereto.

Figure 18:
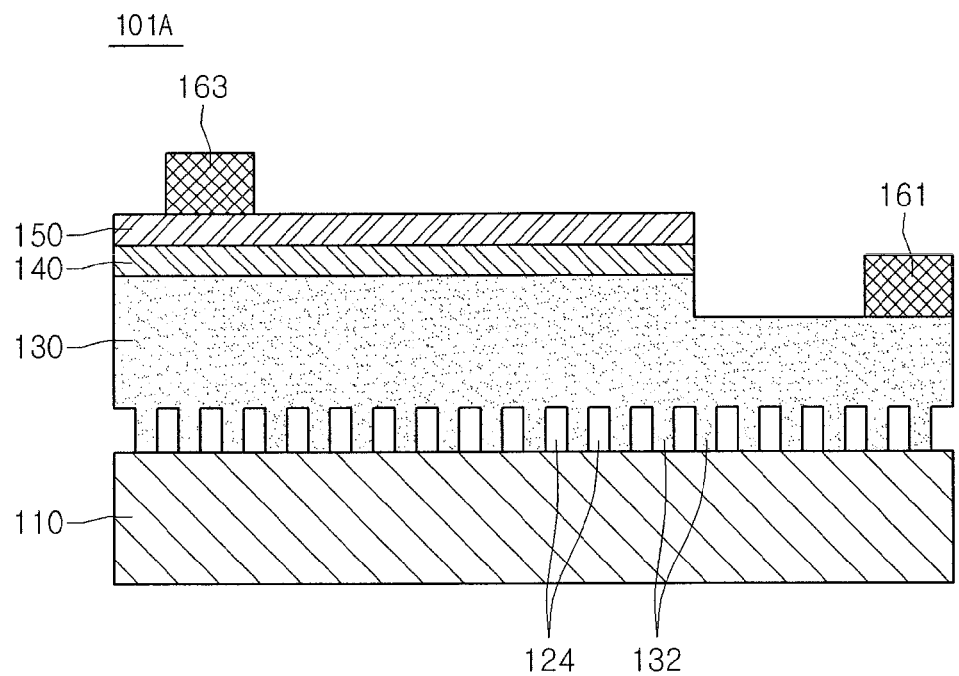
FIG. 18 is a diagram showing a side sectional view of a lateral type light emitting device employing the light emitting device shown in FIG. 6.

FIG. 18 shows a side sectional view of a lateral type light emitting device 101A employing the light emitting device shown in FIG. 6. The light emitting device 101A includes a first electrode 161 that is formed on the first semiconductor layer 130 and a second electrode 163 that is formed on the second conductive type semiconductor layer 150. The first semiconductor layer 130 or an upper portion of the first semiconductor layer 130 may include the first conductive type semiconductor layer, and the rods 132 may include the undoped semiconductor layer or the first conductive type semiconductor layer.

In addition, the light emitting device according to the first to sixth embodiments can be embodied as a lateral light emitting device. In addition, after or before the second electrode 163 has been formed, the reflective electrode layer or the transparent electrode layer can be formed on the second conductive type semiconductor layer 150, but the embodiment is not limited thereto.

Figure 19:
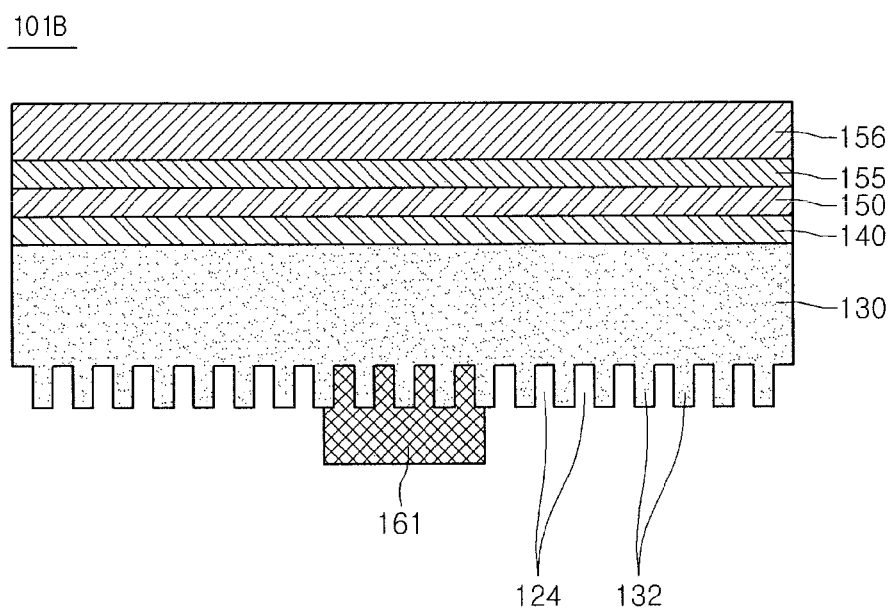
FIG. 19 is a diagram showing a side sectional view of a vertical type light emitting device employing the light emitting device shown in FIG. 6.

FIG. 19 shows a side sectional view of a vertical type light emitting device 101B employing the light emitting device shown in FIG. 6. The light emitting device 101B includes an electrode layer 155 formed on the second conductive type semiconductor layer 150 and a conductive type support member 156 formed on the electrode layer 155.

The electrode layer 155 may include conductive material, which selectively includes transmissive oxide and nitride. For example, the electrode layer 155 may include one selected from the group comprising of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), ZnO, IrOx, RuOx, or NiO. In addition, the electrode layer 155 may include Ag, Ni, Al, Rh, Pd, Ir, Ru, Mg, Zn, Pt, Au, Hf, or a combination thereof. The electrode layer 155 can be formed as a single layer or a multi-layer by using the above materials. When the electrode layer 155 has the multi-layer structure, at least one layer can be disposed in the form of a pattern.

The conductive type support member 156 is formed on the electrode layer 155. The conductive type support member 156 can selectively include Cu, Au, Ni, Mo, Cu—W, or a carrier wafer including GaN, Si, Ge, GaAs, ZnO, SiGe, $Ga_2O_3$ or SiC. A bonding layer can be formed between the electrode layer 155 and the conductive type support member 156. The bonding layer includes a barrier metal or a bonding metal. For example, the bonding layer may include at least one of Ti, Au, Sn, Ni, Cr, Ga, In, Bi, Cu, Ag, or Ta.

A channel layer having the transmissive conductive material or an insulating layer can be formed on a peripheral portion between the electrode layer 155 and the second conductive type semiconductor layer 150. The insulating layer may include one of $SiO_2$, $SiO_x$, $SiO_xN_y$, $Si_3N_4$, $Al_2O_3$, and $TiO_2$.

The substrate 110 may be removed form the under surface of the first semiconductor layer 130 (see, FIG. 1). After removing the substrate 110 from the under surface of the first semiconductor layer 130, the first electrode 161 is formed under the first semiconductor layer 130. In order to remove the substrate 110, an LLO (Laser Lift Off) scheme is performed. According to the LLO scheme, after forming the conductive type support member 156, a laser having a predetermined wavelength is irradiated onto the substrate 110 (see, FIG. 1), thereby removing the substrate 110.

The substrate 110 shown in FIG. 6 can be removed through the LLO scheme after the conductive type support member 156 has been formed. The substrate 110 is removed after or before the wet etching is performed with respect to the mask layer 120 (see, FIG. 8). The wet etching for the mask layer 120 is performed by forming a hole in the substrate 110 after the second conductive type semiconductor layer 150 and/or the conductive type support member 156 has been formed.

When the substrate 110 is removed, the substrate 110 is separated from the rods 132 of the first semiconductor layer 130, so that gas between the rods 132 is discharged to the outside. Thus, the crack defect caused by a difference in thermal expansion coefficients can be reduced in the semiconductor layers, so that the product yield and the reliability can be improved. That is, the rods 132 of the first semiconductor layer 130 can reduce the damage to the crystal structure of the semiconductor layers when the LLO scheme is performed.

The mask layer 120 (see, FIG. 8) can be partially or fully removed through the wet etching process after the substrate 110 has been removed. In order to remove the mask layer 120, the first removing process shown in FIG. 9 and the second removing process, which is performed after the substrate has been removed, can be selectively utilized. When the substrate is removed, if the rods 132 of the first semiconductor layer 130 have a relatively small diameter, the wet etching for the rods 132 of the first semiconductor layer 130 can be rapidly performed and the LLO scheme can be stably performed.

The ICP/RIE (Inductively Coupled Plasma/Reactive Ion Etching) process can be performed with respect to the under surface of the first nitride semiconductor layer 130 where the substrate 110 (see, FIG. 6) has been removed, but the embodiment is not limited thereto. In this case, a part of the rods 132 may be removed.

The first electrode 161 can be formed after or before the chip is separated, but the embodiment is not limited thereto. After the rods 132 have been removed from the under surface of the first semiconductor layer 130, the planar layer or the concave-convex structures can be formed on the under surface of the first semiconductor layer 130. These features can be modified within the technical scope of the embodiment.

The light emitting device 101B is diced into individual chips through the expanding and breaking process. Although the embodiments have been described with reference to the light emitting device, such as the LED, the embodiments can be applied to other semiconductor devices to be formed on the substrate. The embodiments described above may not limit these technical features.

As shown in FIG. 19, the first electrode 161 can directly make contact with the rods 132 and the first semiconductor layer 130. In this case, the rods 132 may be the undoped semiconductor layer or the first conductive type semiconductor layer and the first semiconductor layer 130 may serve as the first conductive type semiconductor layer. The rods 132 may serve as the roughness on the under surface of the first semiconductor layer 130 and thus, the light extracting efficiency can be improved.

The light emitting devices according to the first to seventh embodiments can be embodied as vertical type light emitting devices. The light emitting devices according to the first to seventh embodiments can be embodied as lateral type light emitting devices.

The features disclosed in the above embodiments may not be limited to the embodiments described above, but can be selectively applied to other embodiments. Modifications and substitutions can be realized by selectively combining the above features within the technical scope of the embodiments.

Figure 20:
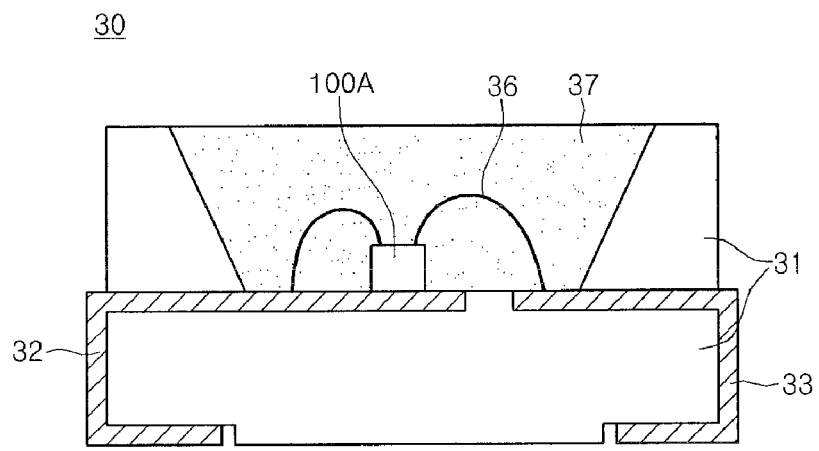
FIG. 20 is a diagram showing a light emitting device package according to the embodiment.

FIG. 20 shows a light emitting device package employing the light emitting device shown in FIG. 18. The following description will be made with reference to the structure of the light emitting device shown in FIG. 18.

Referring to FIG. 20, the light emitting device package 30 includes a body 31, first and second lead electrodes 32 and 33 disposed on the body 31, a light emitting device 100A according to the embodiment installed on the body 31 and electrically connected to the first and second lead electrodes 32 and 33, and a molding member 37 surrounding the light emitting device 100A.

The body 31 may include silicon material, synthetic resin material, or metallic material. An inclined surface can be formed in the vicinity of the light emitting device 100A. The body 31 has a cavity structure having an open upper portion and the light emitting device 100A is installed in the cavity structure.

The first and second lead electrodes 32 and 33 are electrically separated from each other to supply power to the light emitting device 100A. In addition, the first and second lead electrodes 32 and 33 may reflect the light emitted from the light emitting device 100A to improve the light efficiency and dissipate the heat generated from the light emitting device 100A to the outside.

The light emitting device 100A can be installed on the body 31 or on the first and second lead electrodes 32 and 33. The light emitting device 100A can be electrically connected to the first and second lead electrodes 32 and 33 through a wire 36. The molding member 37 protects the light emitting device 100A by surrounding the light emitting device 100A. The molding member 37 may include a phosphor to change the wavelength of the light emitted from the light emitting device 100A.

The light emitting device according to the above embodiments can be selectively employed in the light emitting device package 30. The light emitting device according to the above embodiments is packaged onto the semiconductor board including resin or silicon, the insulating board or the ceramic board and can be used as a light source for an indicator, a lighting system, and a display apparatus. In addition, each embodiment can be selectively applied to other embodiments without limitation.

The light emitting device 100A or the light emitting device package 30 can be applied to a lighting system. The lighting system can be a light device 1100 shown in FIG. 21 or a backlight device 1200 shown in FIG. 22 and can be used in a signal lamp, a head lamp of a vehicle, illumination lamp, or a signboard.

Figure 21:
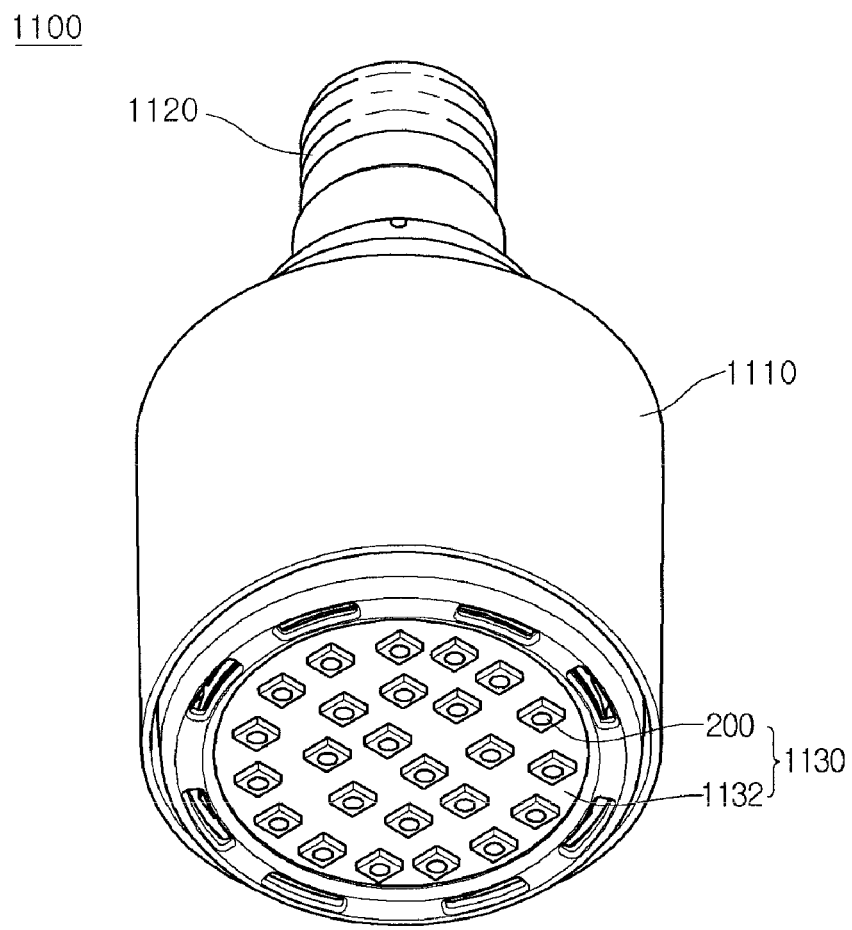
FIG. 21 is a diagram showing a perspective view of a light unit according to the embodiment.

FIG. 21 shows a perspective view of the light device 1100 according to the embodiment. Referring to FIG. 21, the light device 1100 includes a case body 1110, a light emitting module 1130 installed in the case body 1110, and a connection terminal 1120 installed in the case body 1110 that receives power from an external power source. The case body 1110 may be made of material having superior heat dissipation characteristics, such as metal or resin.

The light emitting module 1130 may include a board 1132 and at least one light emitting device package 200 mounted on the board 1132. The light emitting device package 200 may include the light emitting device 100A according to the above embodiments. The board 1132 includes an insulating member printed with a circuit pattern. For example, the board 1132 includes a normal PCB (Printed Circuit Board), a metal core PCB, a flexible PCB, or a ceramic PCB.

In addition, the board 1132 may be made of material capable of effectively reflecting the light. The board 1132 can be coated with a white color or a silver color capable of effectively reflecting the light. At least one light emitting device package 200 can be mounted on the board 1132. Each light emitting device package 200 may include at least one LED 100. The LED 100 may include a color LED capable of emitting light having various colors of red, green, blue and white, and a UV LED that emits ultraviolet ray.

The light emitting module 1130 may have various combinations of the light emitting device packages 200 to achieve desired color and brightness. For example, a white LED, a red LED and a green LED can be selectively arranged to ensure the high CRI (color rendering index).

The connection terminal 1120 is electrically connected to the light emitting module 1130 to supply power. The connection terminal 1120 includes a rotatable socket to couple with the external power source, but the embodiment is not limited thereto. For example, the connection terminal 1120 may include a pin which is inserted into the external power source or connected to the external power source through a wire.

Figure 22:
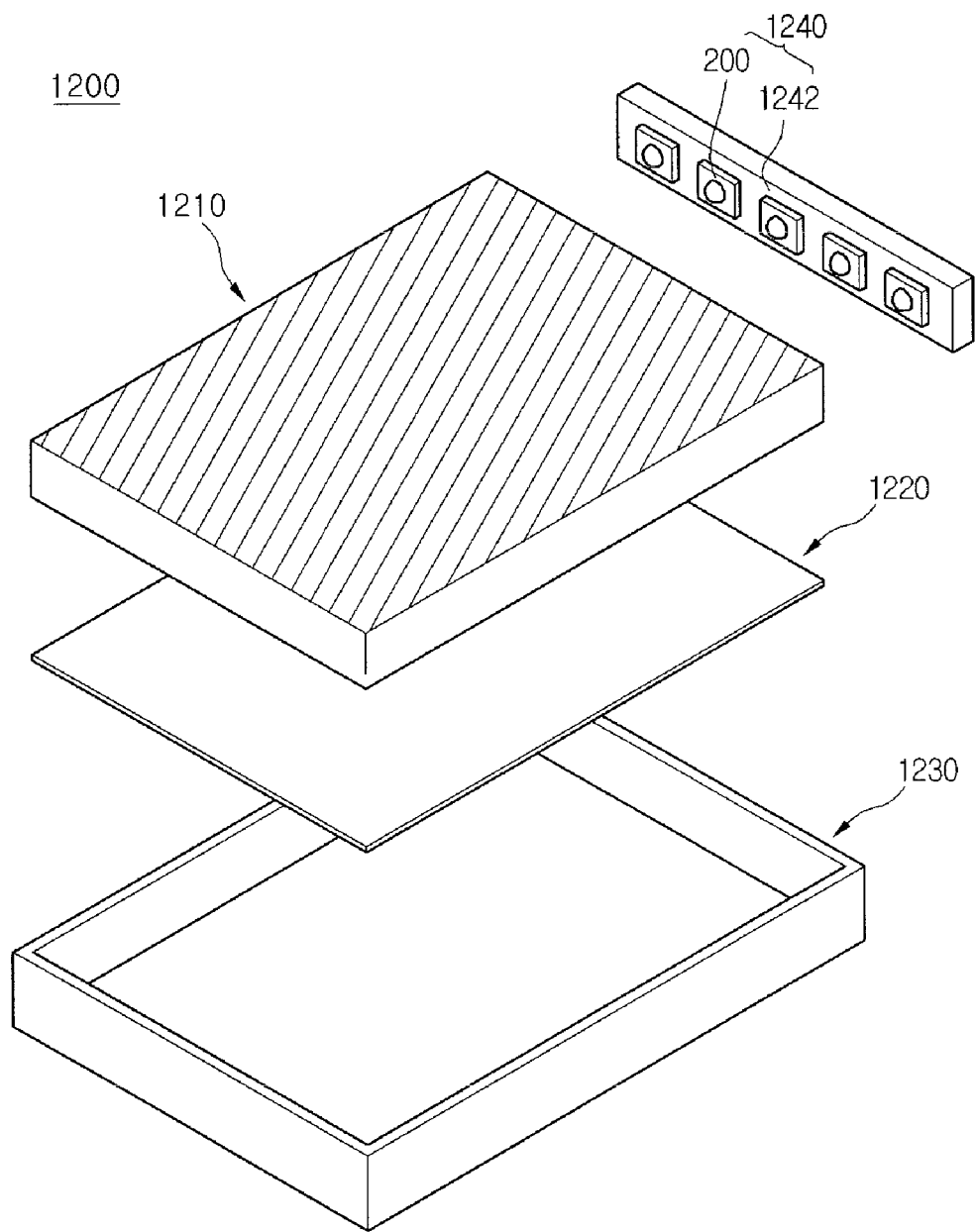
FIG. 22 is a diagram showing a perspective view of a backlight unit according to the embodiment.

FIG. 22 shows an exploded perspective view of a backlight device 1200 according to the embodiment. The backlight device 1200 includes a light guide plate 1210, a light emitting module 1240 supplying light to the light guide plate 1210, a reflective member 1220 disposed under the light guide plate 1210, and a bottom cover 1230 receiving the light guide plate 1210, the light emitting module 1240, and the reflective member 1220.

The light guide plate 1210 diffuses the light to provide a surface light. The light guide plate 1210 includes transparent material. For example, the light guide plate 1210 may include one of acryl resins, such as PMMA (polymethyl methacrylate), PET (polyethylene terephthalate), PC (poly carbonate), COC (cyclo olefin copolymer) and PEN (polyethylene naphthalate).

The light emitting module 1240 supplies light to at least one side of the light guide plate 1210, so that the light emitting module 1240 serves as a light source of a display device employing the backlight unit.

The light emitting module 1240 may include a direct light type light emitting module. In this case, the light guide plate 1210 can be omitted from the backlight unit.

The light emitting device package 200 of the light emitting module 1240 is positioned adjacent to one side of the light guide plate 1210, but the embodiment is not limited thereto. In detail, the light emitting module 1240 includes a board 1242 and a plurality of light emitting device packages 200 formed on the board 1242. The light emitting device packages 200 can be mounted on a thermal plate or on a side of the bottom cover instead of the board 1242. The board 1242 is adjacent to the thermal plate or a metal having a superior heat dissipation characteristic.

The board 1242 may include a PCB printed with a circuit pattern (not shown). In addition, the board 1242 may include a metal core PCB or a flexible PCB, but the embodiment is not limited thereto. An exit surface of the light emitting device package 200, through which the light is emitted to the board 1242, is spaced apart from the light guide plate 1210 by a predetermined distance.

The reflective member 1220 is provided under the light guide plate 1210. The reflective member 1220 reflects the light directed downward from the light guide plate 1210 such that the light is reflected upward, thereby improving the brightness of the backlight device 1200. For example, the reflective member 1220 includes PET, PC or PVC resin, but the embodiment is not limited thereto. The reflective member 1220 may include a reflective material coated on an upper surface of the bottom cover 1230, but the embodiment is not limited thereto.

The bottom cover 1230 can receive the light guide plate 1210, the light emitting module 1240 and the reflective member 1220 therein. To this end, the bottom cover 1230 has a box shape having an open upper portion, but the embodiment is not limited thereto.

The bottom cover 1230 can be fabricated through a pressing process or an extruding process by using a metal or resin. The method of manufacturing the light emitting device according to the embodiment includes the steps of forming a mask layer on a board having a plurality of rod holes, forming a Group III-V compound semiconductor layer on the mask layer, partially exposing the mask layer, and forming air gaps by wet etching the mask layer.

The embodiments may provide a light emitting device having a photonic crystal structure capable of reducing crystal defects of a semiconductor layer and improving light extracting efficiency, and a light emitting device package having the same.

The embodiments may provide a light emitting device including a plurality of rods and/or an air gap under a first semiconductor layer and a light emitting device package having the same.

The embodiments may provide a light emitting device including at least one of a plurality of rods, a mask layer, and an air gap between a substrate and a first semiconductor layer, and a light emitting device package having the same.

The embodiments may provide a light emitting device including a first photonic crystal structure using an air gap under a first semiconductor layer and a second photonic crystal structure having a concave-convex structure between a substrate and a first semiconductor layer, and a light emitting device package having the same.

The embodiments may provide a light emitting device comprising a first semiconductor layer at an under portion thereof with a plurality of rods, an air gaps between the rods of the first semiconductor layer, and a plurality of compound semiconductor layers including an active layer on the first semiconductor layer.

The embodiments may provide a light emitting device comprising a substrate, a first semiconductor layer including a plurality of rods and an air gaps between the rods on the substrate, and a plurality of compound semiconductor layers including an active layer and a second conductive semiconductor layer on the first semiconductor layer, and an electrode layer on the compound semiconductor layers.

The embodiments may provide a light emitting device comprising a mask layer, a plurality of rods in the mask layer, a first semiconductor layer on the rods, and a plurality of compound semiconductor layers including an active layer and a second semiconductor layer on the first semiconductor layer.

The embodiments may provide a light emitting device package comprising a body, a plurality of lead electrodes on the body, a light emitting device electrically connected to the lead electrodes, and a molding member covering the light emitting device, wherein the light emitting device comprises, a first semiconductor layer formed at an under portion thereof with a plurality of rods, an air gaps between the rods of the first semiconductor layer, and a plurality of compound semiconductor layers including an active layer on the first semiconductor layer.

A light emitting device may comprise a first semiconductor layer having a first and second surfaces, the first and second surfaces being opposite surfaces, the first semiconductor layer having a plurality of semiconductor columns extending from the second surface, the plurality of semiconductor columns being separated from each other; a light emitting structure formed over the first semiconductor layer, the light emitting structure including a first conductive semiconductor layer, an active layer and a second semiconductor layer, the light emitting structure having a side surface and an exposed side surface of a semiconductor column closest to the side surface of the light emitting structure being non-aligned with the side surface of the light emitting structure; and a substrate provided adjacent to the plurality of semiconductor columns.

The light emitting device may further comprise at least one group II to VI compound semiconductor layer between the substrate and the plurality of semiconductor columns. A concave-convex structure may be further provided on the substrate.

The first semiconductor layer comprises at least one of an undoped III-V compound semiconductor or a doped semiconductor layer. The first semiconductor layer may include an N type semiconductor layer. A mask material may be left over on some of the plurality of semiconductor columns. The mask material may comprise at least one of Si02, SiOx, SiNx, SiOxNy, or W.

Some of the plurality of semiconductor columns may be located near middle of the plurality of semiconductor columns. Each of the plurality of columns may have at least one of a cylindrical shape or a conical shape. The plurality of columns may be spaced apart at a regular interval or an irregular interval. A periodicity of the plurality of columns may correspond to a periodicity of a photonic crystal structure. The plurality of columns may have a thickness of 20 μm or less. Air gaps may be provided between spacing of the plurality of columns. A gap size of the air gaps may approximately 20 μm or less. A height of the air gaps may be different from a thickness of the plurality of columns.

The second surface of the first semiconductor layer may be uneven. The uneven surface may be a jagged surface. The uneven surface may include a plurality of jagged structures having a height smaller than a height of the plurality of columns. The uneven surface may include an irregular concave-convex structure. The uneven surface may be formed on an entire area or an outer peripheral portion of the second surface of the first semiconductor layer.

The embodiment can improve the light extracting efficiency while reducing the defects caused by the epitaxial growth. The embodiment can improve the light extracting efficiency by using the photonic crystal structure. The embodiment can improve the light extracting efficiency while reducing the defects due to the epitaxial growth by using the hybrid photonic crystal structure. The embodiment can improve the reliability of the light emitting device. The embodiment can minimize the damage to the semiconductor crystal structure caused by the LLO scheme.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a first semiconductor layer having a first and second surfaces, the first and second surfaces being opposite surfaces, the first semiconductor layer having a plurality of semiconductor columns extending from the second surface, the plurality of semiconductor columns being separated from each other;
    a light emitting structure formed over the first semiconductor layer, the light emitting structure including a first conductive semiconductor layer, an active layer and a second semiconductor layer, the light emitting structure having a side surface and an exposed side surface of a semiconductor column closest to the side surface of the light emitting structure being non-aligned with the side surface of the light emitting structure; and
    a substrate disposed under the plurality of semiconductor columns,
    wherein air gaps are provided between spacings of the columns;
    and wherein the second surface of the first semiconductor layer and the top surface of the substrate are uneven surfaces comprising jagged surfaces.

2. The light emitting device of claim 1, wherein the first semiconductor layer comprises at least one of an undoped III-V compound semiconductor or a doped semiconductor layer.

3. The light emitting device of claim 1, wherein some of the plurality of semiconductor columns are located near the middle of the plurality of semiconductor columns.

4. The light emitting device of claim 1, wherein each of the plurality of columns has at least one of a cylindrical shape, or a conical shape.

5. The light emitting device of claim 1, wherein the columns are spaced apart at a regular interval or an irregular interval.

6. The light emitting device of claim 1, wherein the uneven surface of the first semiconductor layer includes a plurality of jagged structures having a height smaller than a height of the columns.

7. The light emitting device of claim 6, wherein the column has a thickness of 20 um or less.

8. The light emitting device of claim 1, wherein the uneven surface of the first semiconductor layer includes an irregular concave-convex structure.

9. The light emitting device of claim 1, wherein the uneven surface of the first semiconductor layer is formed on an entire area or an outer peripheral portion of the second surface of the first semiconductor layer.

10. The light emitting device of claim 1, wherein the first semiconductor layer includes an N type semiconductor layer.

11. The light emitting device of claim 1, wherein a periodicity of the columns corresponds to a periodicity of a photonic crystal structure.

12. The light emitting device of claim 1, wherein the top surface of the substrate is uneven having a concave-convex structure.

13. The light emitting device of claim 1, wherein a gap size of the air gaps is approximately 20 um or less.

14. The light emitting device of claim 1, wherein a height of the air gaps is different from a thickness of the column.

* * * * *